United States Patent [19]

Butters et al.

[11] Patent Number: 4,988,572
[45] Date of Patent: Jan. 29, 1991

[54] COATING COMPOSITION

[75] Inventors: Alan Butters; Graham A. Page, both of Ipswich, England

[73] Assignee: Imperial Chemical Industries PLC, London, England

[21] Appl. No.: 373,390

[22] Filed: Jun. 30, 1989

Related U.S. Application Data

[62] Division of Ser. No. 32,400, Mar. 31, 1987, Pat. No. 4,857,568.

[30] Foreign Application Priority Data

Apr. 21, 1986 [GB] United Kingdom ............... 8609704

[51] Int. Cl.⁵ .................. C08K 5/13; C08L 63/00; B32B 27/30; B32B 27/38
[52] U.S. Cl. .................... 428/413; 525/417; 525/523; 423/456; 528/123; 528/104; 252/79.1
[58] Field of Search ............ 523/456; 525/523, 419; 528/104, 123; 428/413

[56] References Cited

U.S. PATENT DOCUMENTS

| | | | |
|---|---|---|---|
| 3,766,299 | 10/1973 | Dornte | 528/123 |
| 3,781,522 | 9/1973 | Schneider et al. | 528/123 |
| 4,214,039 | 7/1980 | Steiner et al. | 428/414 |
| 4,487,806 | 12/1984 | Sellstrom et al. | 525/523 |
| 4,547,562 | 10/1985 | Nichols | 528/119 |

FOREIGN PATENT DOCUMENTS

| | | |
|---|---|---|
| 101210 | 2/1984 | European Pat. Off. |
| 102209 | 3/1984 | European Pat. Off. |
| 156532 | 10/1985 | European Pat. Off. |
| 737430 | 6/1980 | U.S.S.R. ............... 525/523 |

OTHER PUBLICATIONS

Chemical Abstracts, 87.86024S.

Primary Examiner—George F. Lesmes
Assistant Examiner—Elizabeth M. Cole
Attorney, Agent, or Firm—Cushman, Darby & Cushman

[57] ABSTRACT

A coating composition for a plastics substrate such as a polyester film, comprises a polymeric amine, a polyepoxyresin and an etchant, and optionally includes a vinyl polymer. The composition is of utility as a priming medium in the production of photographic and reprographic elements, printing plates, inkable sheets, and the like.

4 Claims, 1 Drawing Sheet

COATING COMPOSITION

This is a division of application Ser. No. 07/032,400, filed Mar. 31, 1987, now U.S. Pat. No. 4,857,568.

BACKGROUND OF INVENTION (a) Technical Field of Invention

This invention relates to a coating composition and, in particular, to a composition for priming a polymeric substrate.

(b) Background of the Art

The problems of achieving effective bonding between the respective layers of a multi-laminar polymeric assembly are well known, and are encountered in relation to a variety of end-use applications. For example, the production of a photographic film may involve the bonding of a light-sensitive emulsion to a relatively unreceptive hydrophobic substrate such as a film of a linear polyester resin. Similarly, it may be necessary to adhere a layer of a photopolymerisable resin to a base sheet in the production of a relief printing plate. It has therefore become established practice to provide an intermediate anchor coating or primer layer on a polymeric substrate to promote the adhesion thereto of a subsequently applied layer or layers.

(c) The Prior Art

European patent publication EP-A-156532 relates to the production of an inkable recording sheet, suitable for use with an ink jet printer, and discloses that an ink-absorbent resin layer may be bonded to a self-supporting polymeric film substrate by a priming medium which comprises a swelling agent and, preferably, a partially hydrolysed vinyl chloride-vinyl acetate copolymer.

A similar priming medium is disclosed in European patent publication EP-A-101210 as being suitable for bonding a resin layer to a polymeric substrate in an assembly adapted to receive a photopolymerisable material in the production of a relief printing plate.

Although, in general, such a priming medium has proved to be eminently satisfactory in the specified products, a problem of relatively inferior adhesive bonding has been observed between a polymeric, especially a polyester, substrate and a limited class of resin layers applied thereto. Applied resin layers which are susceptible to poor bonding include cellulosics, such as hydroxyethylcellulose and cellulose acetatephthalate, and polymers of acrylic and/or methacrylic acid.

We have now devised a coating composition which, although of general applicability, is particularly suitable for use as a priming medium with the aformentioned resins.

SUMMARY OF THE INVENTION

Accordingly, the present invention provides a composition for coating a plastics substrate characterised in that the composition comprises a polymeric amine, a polyepoxy resin and an etchant for the substrate. In a preferred embodiment of the invention the composition additionally comprises a vinyl polymer.

The invention also provides a primed article comprising a polymeric substrate having, on at least on surface thereof, a layer of a composition comprising a polymeric amine, a polyepoxy resin and an etchant for the substrate.

The invention further provides a method of producing a primed article comprising applying to at least one surface of a polymeric substrate a coating composition comprising a polymeric amine, a polyepoxy resin and an etchant for the substrate.

DETAILED DESCRIPTION AND PREFERRED EMBODIMENTS OF THE INVENTION

Figure 1:
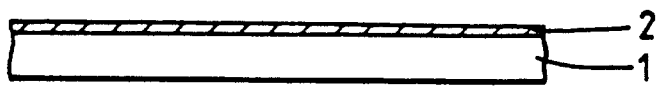

A polymeric amine suitable for use in the compositions of the invention desirably has a molecular weight of at least 200, and preferably at least 500. Poly (alkyleneimines) which are generally available in a range of molecular weights from about 500 to 100,000 are particularly suitable polymeric amines, the alkylene group thereof conveniently comprising from 2 to 4 carbon atoms. A prefered amine is a poly (ethyleneimine).

Poly (ethyleneimines) are available in linear or branched form, as represented by the general formulae:

and

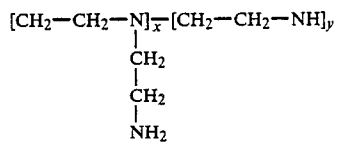

wherein: x and y are integers. A branched poly (ethyleneimine), containing tertiary, secondary and primary amino groups, provides a range of reactive hydrogen atoms, and therefore is a preferred component of the coating composition. Such a component suitably exhibits a Brookfield Viscosity (at 20° C. and 20/minute of from 15,000 to 30,000, preferably from 17,000 to 28,000, mPa.s.

A polyepoxy resin suitable for inclusion in the coating composition comprises at least two 1,2-epoxy ring structures in the molecule, and is conveniently derived from an epoxy compound of the general formula:

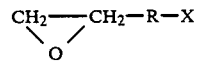

wherein:
R is an alkylene group (branched or linear) of up to 4 carbon atoms, and
X is a reactive group, particularly a halogen—such as chlorine or bromine.

Such epoxy compounds include an epihalohydrin, particularly epichlorohydrin or β-methylepichlorohydrin.

A preferred polyepoxy resin is prepared by condensation of the reactive group X of the aforementioned compound with a compound containing and active Hydrogen atom—in for example, a phenolic hydroxyl, a carboxylic or an amino group. Suitable reactive compounds include 4,4'-diaminodiphenylmethane, 1,4-butanediol, resorcinol, glycerol, pentaerythritol and phenolic novolacs. A particularly preferred polyepoxyresin is obtained by condensation of epichlorohydrin with a bisphenol A to yield a polymer having the repeat unit:

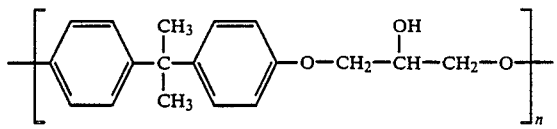

wherein: n is an integer.

The polyepoxy resin suitably has an epoxy molar mass (grams of resin containing 1 gram-equivalent of epoxide) of from about 100 to 5,000, preferably from about 150 to about 250, and particularly from 180 to 195.

An etchant for inclusion in the coating composition suitably comprises an agent having a solvent or swelling action on the substrate polymer. Examples of such agents, which are particularly suitable for the treatment of polyester substrates, are halogenated phenols, such as p-chloro-m-cresol, 2,4-dichlorophenol, 2,4,5- or 2,4,6- trichlorophenol or 4-chlororesorcinol.

The relative proportions of the respective components in the coating composition may be varied over a wide range, as required, but conveniently a composition comprises polymeric amine, polyepoxyresin and etchant in a weight ratio of (10 to 1):(1.0):(450 to 1), preferably of (5 to 1):1.0:(100 to 2), and particularly preferably of (5 to 2):1.0:(50 to 5).

The coating composition is conveniently applied to a polymeric substrate by a conventional coating technique—for example, by deposition from a solution or dispersion of the resin(s) in a volatile medium, such as an aqueous or an aqueous-organic solvent medium, but preferably an organic solvent medium—such as acetone, methyl ethyl ketone, isopropanol, or mixtures thereof.

Drying of the applied coating composition may be effected by a conventional drying technique—for example, by suspending the coated substrate in a hot air oven maintained at an appropriate temperature to cure the applied resin composition. A drying temperature of from about 100 to 120° C., is usually suitable for a polyester substrate.

The coating composition is suitably applied to a substrate at a concentration level which will yield a priming layer having a relatively thin dry coat thickness—for example, generally less than 2 microns, preferably less than 1 micron, and particularly from 0.1 to 0.5 micron.

If desired, a plurality of layers of the coating composition, optionally containing differing components, may be sequentially applied to a substrate, although the preferred systems of the invention generally obviate the need for more than one primer layer.

In a preferred embodiment of the invention the coating composition additionally comprises a vinyl polymer—for example, in a weight ratio, relative to the polyepoxyresin, of from (0 to 15):1, and preferably from (1 to 10):1. Suitable vinyl polymers include homo-, co- and ter-polymers.

A suitable vinyl homo-polymer comprises polyvinylpyrrolidone, although, if preferred the vinyl pyrrolidone may be copolymerised—for example, with a copolymerisable monomer, such as vinyl acetate.

Vinyl chloride polymers are also suitable components of the coating composition, particularly a vinyl chloride/vinyl acetate copolymer of average molecular weight in the range 1,000 to 100,000 preferably 5,000 to 25,000 and which contains 60 to 98 wt % vinyl chloride, 2 to 20 wt % vinyl acetate and, optionally, up to 20 wt % of a termonomer.

The vinyl chloride-vinyl acetate copolymer is a relatively low molecular weight material, and the average molecular weight (number average) thereof is more preferably in the range 6,000 to 16,000, especially 6,000 to 10,000.

A partially hydrolysed vinyl chloride-vinyl acetate copolymer is also suitable as a component of the coating composition, particularly such a copolymer which contains from 60 to 98 per cent of vinyl chloride, and from 0.5 to 3% of hydroxyl units, by weight of the copolymer. The molecular weight (number average) of such a copolymer is conveniently in a range of from 10,000 to 30,000, and preferably from 16,500 to 25,000.

If desired, the coating composition may additionally comprise a further component to promote adhesion thereto of a subsequently applied resin layer, particularly a component which is compatible with the applied resin. For example, in the production of an inkable sheet having an ink-absorbent layer comprising cellulose acetate phthalate, the coating composition employed to form an intermediate priming layer on the polymeric substrate may additionally comprise a carboxylated cellulose ester.

The substrate may comprise any suitable polymeric material in a configuration governed essentially by the envisaged end-use therefor. Typically, the substrate with normally be in the form of a self-supporting film, sheet of plate.

By a "self-supporting film, sheet or plate" is meant a structure capable of an independent existence in the absence of a supporting base.

Suitable polymeric materials for use in the production of a substrate are usually thermoplastics polymers, and include cellulose esters, e.g. cellulose acetate, polystyrene, polyamides, polymers and copolymers of vinyl chloride, polymers and copolymers of olefines, e.g. polypropylene, polysulphones, polycarbonates and particularly linear polyesters which may be obtained by condensing one or more dicarboxylic acids or their lower alkyl (up to 6 carbon atoms) diesters, e.g. terephthalic acid, isophthalic acid, phthalic acid, 2,5-, 2,6- and 2,7- naphthalene dicarboxylic acid, succinic acid, sebacic acid, adipic acid, azelaic acid, diphenyldicarboxylic acid and hexahydroterephthalic acid or bis-p-carboxyl phenoxy ethane (optionally with a mono-carboxylic acid, such as pivalic acid) with one or more glycols, e.g. ethylene glycol, 1,3-propanediol, 1,4-butanediol, neopentyl glycol and 1,4-cyclohexane-dimethanol. A biaxially oriented and heat-set film of polyethylene terephthalate is particularly useful as a substrate for the production of inkable sheets and printing plate assemblies, and may be produced by any of the processes known in the art, for example—as described in British patent GB No. 838708.

The thickness of the substrate will depend, inter alia, on the envisaged end-use but will generally be within a range of from 2 to 3000 microns, and particularly from 50 to 175 microns for use in inkable sheets and the like.

A primed substrate prepared according to the invention is receptive to a variety of further resin coatings for a range of applications. Such further coatings include (1) ink-absorbent coatings, such as (a) a resin matrix comprising a vinyl pyrrolidone polymer and an ester of cellulose containing free carboxylic acid groups, (b) a resin comprising a vinyl pyrrolidone polymer and an acrylic or methacrylic polymer (c) a resin comprising an acrylic or methacrylic polymer containing free carboxylic acid groups and a plasticiser therefor, and (d) a porous layer of a hydroxy ethyl cellulose resin, (2) laser-imageable coatings, such as a transfer layer comprising energy absorbent particles dispersed in a binder resin comprising nitrocellulose or an alkyl cellulose, (3) adhesive resin coatings to receive a photopolymerisable material in the production of relief printing plates, (4) tackifier resin coatings in the production of montage foils, (5) photographic subbing coatings, and (6) light-sensitive emulsion coatings in the preparation of photographic elements, and the like.

The coating compositions of the invention, and substrates primed therewith, are therefore of utility in a variety of applications including the production of photographic and reprographic elements and films, montage foils, printing plates, laser-imageable assemblies, projection transparencies, thermal transfer donor sheets, and inkable elements—such as ink-jet recording sheets and pen plotter films.

Figure 2:
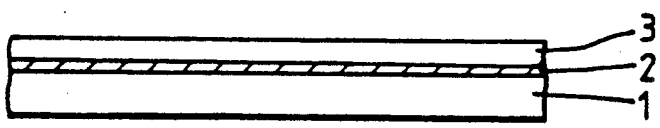
Figure 3:
Figure 4:
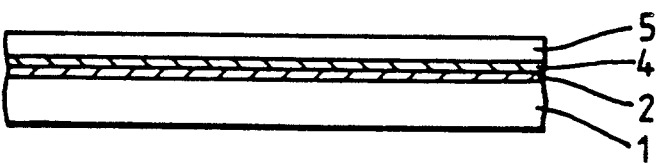

The invention is illustrated by reference to the accompanying drawings in which:

FIG. 1 is a schematic elevation (not to scale) of a portion of a sheet comprising a polymeric film substrate 1 to one surface of which a primer coating composition has been applied, and dried to form a primer layer 2, FIG. 2 is a fragmentary schematic elevation of a similar sheet in which an ink-absorbent resin layer 3 has been deposited on the primer layer, FIG. 3 is a fragmentary schematic elevation of a sheet incorporating an additional primer layer 4, and FIG. 4 illustrates the deposition of an ink-absorbent layer 5 onto the primed sheet of FIG. 3.

The invention is further illustrated by reference to the following Examples.

EXAMPLES 1 to 9

One surface of a biaxially oriented, uncoated, polyethylene terephthalate film substrate sheet of about 100 microns thickness was primed with a solution in acetone of p-chloro-m-cresol (4% weight/vol), EPIKOTE 828, an unmodified Bisphenol A-epichlorohydrin epoxide resin, (0.11% weight/vol) and POLYMIN P, a poly(ethyleneimine) (0.29% weight/vol).

The primed sheet was then dried in a hot air oven maintained at a temperature of 110° C. to leave a residual prime layer of approximately 0.1 micron thickness on the substrate.

The primed surface was then coated with the following solution:

| | |
|---|---|
| Methanol | 100 ml |
| Polycarboxylic Acid (ROHAGIT SNV) | 6 g |
| Quat Ammonium salt (CYASTAT SP) | 1.8 g |
| Tetraethylene Glycol | 1.5 g | and the coated sheet was dried at a temperature of 110° C. to yield a resin coating layer (A) of about 6 microns thickness on the primed surface.

Adhesion of the resin layer to the primed surface was assessed by scratching the resin surface with a razor blade to inscribe thereon a cross-hatched pattern comprising two intersecting series of four parallel lines to form 9 rhombohedral segments. A strip of SELLOTAPE adhesive tape was then firmly pressed into contact with the cross-hatched pattern, and slowly peeled away therefrom in an attempt to remove the segments. Up to 9 successive applications and removals of the adhesive tape were made to each pattern, the peel value of a particular assembly being expressed as the ratio of number of segments removed/number of applications of adhesive tape. Thus a peel value of 0/9 indicates excellent adhesion of the resin layer to the primed surface, whereby no segments were removed by 9 successive applications of the adhesive tape. A peel value of 9/6 indicates good adhesion whereby removal of all 9 segments required 6 successive applications of the adhesive tape.

The procedure of Example 1 was repeated with various primer and resin coating systems and the results obtained are listed in the following Table:

TABLE 1

| Example | 1 | 2 | 3 | 4 | 5 | 6 | 7 | 8 | 9 |
|---|---|---|---|---|---|---|---|---|---|
| Primer solution (% wt/vol) | | | | | | | | | |
| PCMC | 4.0 | 4.0 | 1.89 | 3.02 | 3.4 | 3.6 | 3.75 | 3.4 | 3.4 |
| EPIKOTE 828 | 0.11 | 0.11 | 0.38 | 0.15 | 0.08 | 0.04 | 0.008 | 0.08 | 0.08 |
| POLYMIN P | 0.29 | 0.29 | 1.02 | 0.41 | 0.20 | 0.10 | 0.020 | 0.20 | 0.20 |
| PVP K15 | — | 0.16 | — | — | — | — | — | — | — |
| VAGH | — | — | 0.39 | 0.62 | 0.70 | 0.74 | 0.77 | 0.70 | 0.70 |
| Resin Coat | A | A | A | A | A | A | A | B | C |
| Peel Value | 0/9 | 0/9 | 0/9 | 0/9 | 0/9 | 9/6 | 9/1 | 0/9 | 0/9 |

Notes

| | |
|---|---|
| PCMC | p-chloro-m-cresol |
| EPIKOTE 828 | an unmodified Bisphenol A-epichlorohydrin epoxide resin |
| POLYMIN P | a polyethyleneimine |
| PVP K15 | a polyvinylpyrrolidone resin |
| VAGH | VINYLITE VAGH : a copolymer of vinyl chloride (90 wt %) and vinyl acetate (4 wt %) with 2.3 wt % hydroxyl content and average molecular weight 23,000. |
| Resin Coat A | polycarboxylic acid resin system, hereinbefore specified |

| Resin Coat B | Water | 3.75 l |
|---|---|---|
| | Hydroxyethylcellulose | 2 kg |
| | Methanol | 18.75 l |
| | Particulate Silica (DEGUSSA FK 320 DS) | 0.8 g |
| Resin Coat C | Water | 4.6 l |
| | polyvinylacetate resin | 800 g |
| | fluorocarbon surfactant (FC431) | 8 g |
| | Methanol | 11.2 l |
| | Silica (GASIL EBN) | 8.5 g |
| | Polyvinylpyrrolidone (PVP-K15) | 800 g |
| | Cellulose acetate phthalate | 480 g |
| | Ammonia soln (0.915 g) | 80 ml |

EXAMPLES 10 to 13

These are comparative Examples, not according to the invention, in which the priming medium did not contain an epoxy resin.

The procedure of Example 8 was repeated, save that the primer medium was as specified in the following Table. In Examples 11 to 13 the primer medium was applied as two distinct layers (primer 1 and primer 2), the respective layers being independently dried at a temperature of 100° C.

TABLE 2

| Example | 10 | 11 | 12 | 13 |
|---|---|---|---|---|
| Primer 1 (% wt/vol) | | | | |
| PCMC | 5.0 | 0.5 | 5.0 | 2.0 |
| PVP K15 | 1.0 | — | — | — |
| VAGH | — | 1.0 | 1.0 | — |
| Primer 2 (% wt/vol) | | | | |
| PVP K15 | — | 1.0 | — | — |
| Nitrocellulose | — | — | 1.0 | 1.0 |
| Resin Coat | B | B | B | B |
| Peel Value | 9/1 | 9/1 | 9/1 | 9/1 |

Note: Abbreviations - as in Table 1.

Examples 14 to 19

These Examples demonstrate the utility of coating compositions according to the invention in the production of printing plates.

One surface of a biaxially oriented, uncoated, polyethylene terephthalate film substrate sheet of about 100 microns thickness was primed with a solution in acetone/isopropanol/methylethyl ketone (approx 50/5/1 by volume) of p-chloro-m-cresol (3.4% weight/vol), EPON 828, an unmodified Bisphenol A-epichlorohydrin epoxide resin, (0.08% weight/vol), POLYMIN P, a poly(ethyleneimine) (0.22% weight/vol), and VINYLITE VAGH (0.67% weight/vol).

The primed sheet was then dried in a hot air oven maintained at a temperature of 110° C. to leave a residual prime layer of approximately 0.3 micron thickness on the substrate.

The primed surface was then coated with the following solution:

| | |
|---|---|
| Methanol | 200 l |
| Polycarboxylic Acid (ROHAGIT SNV) | 12 kg |
| Quat Ammonium salt (CYASTAT SP) | 12 kg |
| Tetraethylene Glycol | 3 kg | and the coated sheet was dried at a temperature of 110° C. to yield a resin coating layer (D) of about 5 microns thickness on the primed surface.

By solvent-lamination, using an aqueous-ethanolic solvent (approx 3:1 by volume) the resin coated surface of a sample of the coated substrate was bonded to each surface of a layer of a photopolymerisable resin comprising a blend (50:50 by weight) of an acrylic resin and a partially saponified (~82%) vinyl alcohol polymer. The laminate was dried at a temperature of 50° C. for 1 hour to yield a sandwich comprising a photopolymer core between opposed layers of the coated substrate.

The laminate was then cut into strips of 2 cm width. A free tab end of each strip (formed by masking with adhesive tape during lamination) enabled each strip to be gripped in the jaws of an INSTRON tensile tester, the force required to separate the polyester from the photopolymer layer being displayed on a chart recorder. Recorded adhesion values (kg/2 cm) are the average of 4 tensile tests, and includes the Maximum observed value and the Mean value from the 4 recorder traces.

The above procedure was repeated with various primer and resin coating systems and the results obtained are listed in the following Table:

TABLE 3

| Example | 14 | 15 | 16 | 17 | 18 | 19 |
|---|---|---|---|---|---|---|
| Primer Solution (% wt/vol) | | | | | | |
| PCMC | 3.40 | 3.42 | 3.12 | 3.40 | 3.40 | 3.8 |
| EPON 828 | 0.08 | 0.07 | 0.12 | 0.07 | 0.07 | — |
| POLYMIN P | 0.22 | 0.18 | 0.34 | 0.09 | 0.37 | — |
| VAGH | 0.67 | 0.69 | 0.62 | 0.68 | 0.68 | 0.75 |
| Resin Coat | D | E | E | E | E | E |
| Adhesion (kg/2 cm) | | | | | | |
| Maximum | 5.6 | 3.6 | 3.9 | 4.5 | 4.3 | 0 |
| Mean | 2.7 | 1.7 | 2.0 | 2.3 | 1.6 | 0 |

Notes:

Example 19 is comparative, not according to the invention. In Examples 14 to 18, the photopolymer layer split during the adhesion test.

Resin Coat D: polycarboxylic acid resin system, hereinbefore identified.

| Resin Coat E: Methanol | 200 l |
|---|---|
| ROHAGIT SNV | 12 kg |
| CYASTAT SP | 12 kg |
| Tetraethylene Glycol | 1.5 kg |

EXAMPLES 20 to 26

These Examples also demonstrate the utility of coating compositions according to the invention in the production of printing plates.

One surface of a biaxially oriented, uncoated, polyethylene terephthalate film substrate sheet of about 100 microns thickness was primed with a solution in acetone/isopropanol/mathylethylketone (approx 50/5/1 by volume) (3.5% weight/vol), EPON 828, an unmodified Bisphenol A-epichlorohydrin epoxide resin, (0.15% weight/vol), POLYMIN P, a poly(ethyleneimine) (0.13% weight/vol) and VINYLITE VAGH (0.70% weight/vol).

The primed sheet was then dried in a hot air oven maintained at a temperature of 100° C. to leave a residual prime layer of approximately 0.2 micron thickness on the substrate.

The primed surface was then coated with the following solution:

| | |
|---|---|
| Methylethylketone | 100 l |
| ATLAC (a propoxylated Bisphenol A Furmarate polyester) | 8 kg | and the coated sheet was dried at a temperature of 110° C. to yield a resin coating layer (F) of about 1 micron thickness on the primed surface.

A sandwich structure was assembled comprising a core layer of a photopolymer designated FA 240.8 (supplied by Hercules Inc) and on each surface thereof a layer of coated substrate, the resin coated surface of the substrate being in contact with the respective surfaces of the core layer. The structure was rolled to reduce the thickness of the photopolymer layer to about 1 mm, and the structure was then exposed UV irradiation to harden the photopolymer. The resultant cured laminate was then cut into strips of about 1 cm width, to facilitate assessment of the adhesion between the polyester substrate and photopolymer using an INSTRON tensile tester, as hereinbefore described.

The above procedure was repeated with various primer and resin coating systems and the results obtained as listed in the accompanying table.

TABLE 4

| Example | 20 | 21 | 22 | 23 | 24 | 25 | 26 |
|---|---|---|---|---|---|---|---|
| Primer Solution (% wt/vol) | | | | | | | |
| PCMC | 3.50 | 3.41 | 3.41 | 3.26 | 3.40 | 3.8 | 5.0 |
| EPON 828 | 0.15 | 0.14 | 0.21 | 0.20 | 0.07 | — | — |
| POLYMIN P | 0.13 | 0.09 | 0.19 | 0.13 | 0.09 | — | — |
| VAGH | 0.70 | 0.68 | 0.68 | 0.65 | 0.68 | 0.75 | 1.0 |
| Resin Coat | F | F | F | F | F | F | F |
| Adhesion | | | | | | | |
| (lb/inch) | 4.46 | 4.55 | 4.61 | 4.42 | 4.0 | 2.24 | 1.38 |
| (kg/cm) | 0.79 | 0.81 | 0.82 | 0.79 | 0.71 | 0.39 | 0.25 |

Notes:
In Examples 20 to 24 the photopolymer layer split during the adhesion test
Examples 25 and 26 are comparative, not according to the invention.
Resin coat F: ATLAC resin system, hereinbefore identified.

EXAMPLES 27 to 31

The procedure and tests of example 1 were repeated using the primers identified in accompanying Table 5 to provide comparative data. Examples 28 to 31 are not according to the invention, the resin coating in Example 30 being applied to an unprimed film substrate.

TABLE 5

| Example | 27 | 28 | 29 | 30 | 31 |
|---|---|---|---|---|---|
| Primer solution (% wt/vol) | | | | | |
| PCMC | 3.6 | 3.6 | 3.6 | — | — |
| EPIKOTE 828 | 0.04 | 0.04 | — | — | 0.76 |
| POLYMIN P | 0.10 | — | 0.10 | — | 2.00 |
| Resin Coat | A | A | A | A | A |
| Peel Value | 0/8 | 9/1 | 7/8 | 9/1 | 9/1 |

We claim:

1. A primed article comprising a polymeric substrate having, on at least one surface thereof, a layer of a composition for coating a plastics substrate wherein the composition comprises a polymeric amine, a polyepoxy resin and an etchant for the substrate, the polymeric amine, polypepoxy resin and etchant being present in the composition in a weight ratio of 10 to 1:1.0:450 to 1, the polymeric amine being poly(ethyleneimine), the polyepoxy resin being a bisphenol A-epichlorohydrin condensate and the etchant being a halogenated phenol.

2. An article according to claim 1 wherein the substrate comprises an oriented polyester film, sheet or plate.

3. A method of producing a primed article comprising applying to at least one surface of a polymeric substrate a coating composition which comprises a polymeric amine, a polyepoxy resin and an etchant for the substrate, the polymeric amine, polyepoxy resin and etchant being present in the composition in a weight ratio of 10 to 1:1.0:450 to 1, the polymeric amine being poly(ethyleneimine), the polyepoxy resin being a bisphenol A-epichlorohydrin condensate and the etchant being a halogenated phenol.

4. A composition for coating a plastics substrate wherein the composition comprises a polymeric amine, a polyepoxy resin, an etchant for the substrate and a vinyl polymer, the polymeric amine, polyepoxy resin and etchant being present in the composition in a weight ratio of 10 to 1:1.0:450 to 1, the polymeric amine being poly(ethyleneimine), the polyepoxy resin being a bisphenol A-epichlorohydrin condensate and the etchant being a halogenated phenol, wherein the vinyl polymer is selected from the group consisting of a vinyl pyrrolidone polymer, a vinyl chloride polymer and a partially hydrolysed vinyl chloride-vinyl acetate copolymer.

* * * * *